United States Patent [19]

Thorsrud et al.

[11] 4,227,244
[45] Oct. 7, 1980

[54] CLOSED LOOP ADDRESS

[75] Inventors: Lee T. Thorsrud, St. Paul; Gary A. Spencer, Richfield, both of Minn.

[73] Assignee: Sperry Corporation, New York, N.Y.

[21] Appl. No.: 964,992

[22] Filed: Nov. 30, 1978

[51] Int. Cl.[2] .................... G06F 11/00; G11C 29/00
[52] U.S. Cl. .................................. 364/200; 371/21; 371/24
[58] Field of Search ... 364/200 MS File, 900 MS File; 235/302.3, 312; 365/201; 340/146.1 BA

[56] References Cited

U.S. PATENT DOCUMENTS

| | | | |
|---|---|---|---|
| 3,228,000 | 1/1966 | Collis | 340/146.1 BA |
| 3,270,318 | 8/1966 | Strawbridge | 235/312 X |
| 3,665,175 | 5/1972 | Bouricius et al. | 364/200 X |
| 3,982,111 | 9/1976 | Lerner et al. | 235/312 |

*Primary Examiner*—Raulfe B. Zache
*Attorney, Agent, or Firm*—John L. Rooney; Kenneth T. Grace; Marshall M. Truex

[57] ABSTRACT

An apparatus for enabling a central processing unit (CPU) to directly read the address transferred to a memory module to permit the CPU to test the address circuitry of the memory module without actually referencing an addressable location of the memory array within the memory module. A status register located within the memory module has two bit positions assigned to controlling the closed loop address capability. If the two assigned bit positions contain binary zeroes, the memory module operates normally by using each address received to address one addressable location of the memory array of the memory module. If one of the assigned bit positions contains a binary one, subsequent read commands cause the memory not to access the memory arrays but to return the portion of the address corresponding to the bit position containing the binary one (i.e., one bit position causes part of the address to be returned whereas the other bit position causes the remainder of the address to be returned) to the requesting CPU as if it were data read from the contents of the specified addressable location, thus permitting the CPU to directly verify the correct operation of the addressing circuitry of the memory module. Since the assigned bit positions of the status register may be easily altered under software control, the closed loop address capability may be rapidly and automatically invoked to periodically verify the correct operation of the addressing circuitry of the memory module.

8 Claims, 13 Drawing Figures

| ARRAY | COLUMN ADDRESS | ROW ADDRESS | U/L |
|---|---|---|---|
| 17 -- 15 | 14 ----------- 8 | 7 ------------ 1 | 0 |

| ALL ONES | ARRAY | ROW ADDRESS | U/L |
|---|---|---|---|
| 31 --------------- 11 | 10 -- 8 | 7 ---------- 1 | 0 |

| ALL ONES | ARRAY | COLUMN ADDRESS | U/L |
|---|---|---|---|
| 31 --------------- 11 | 10 -- 8 | 7 ---------- 1 | 0 |

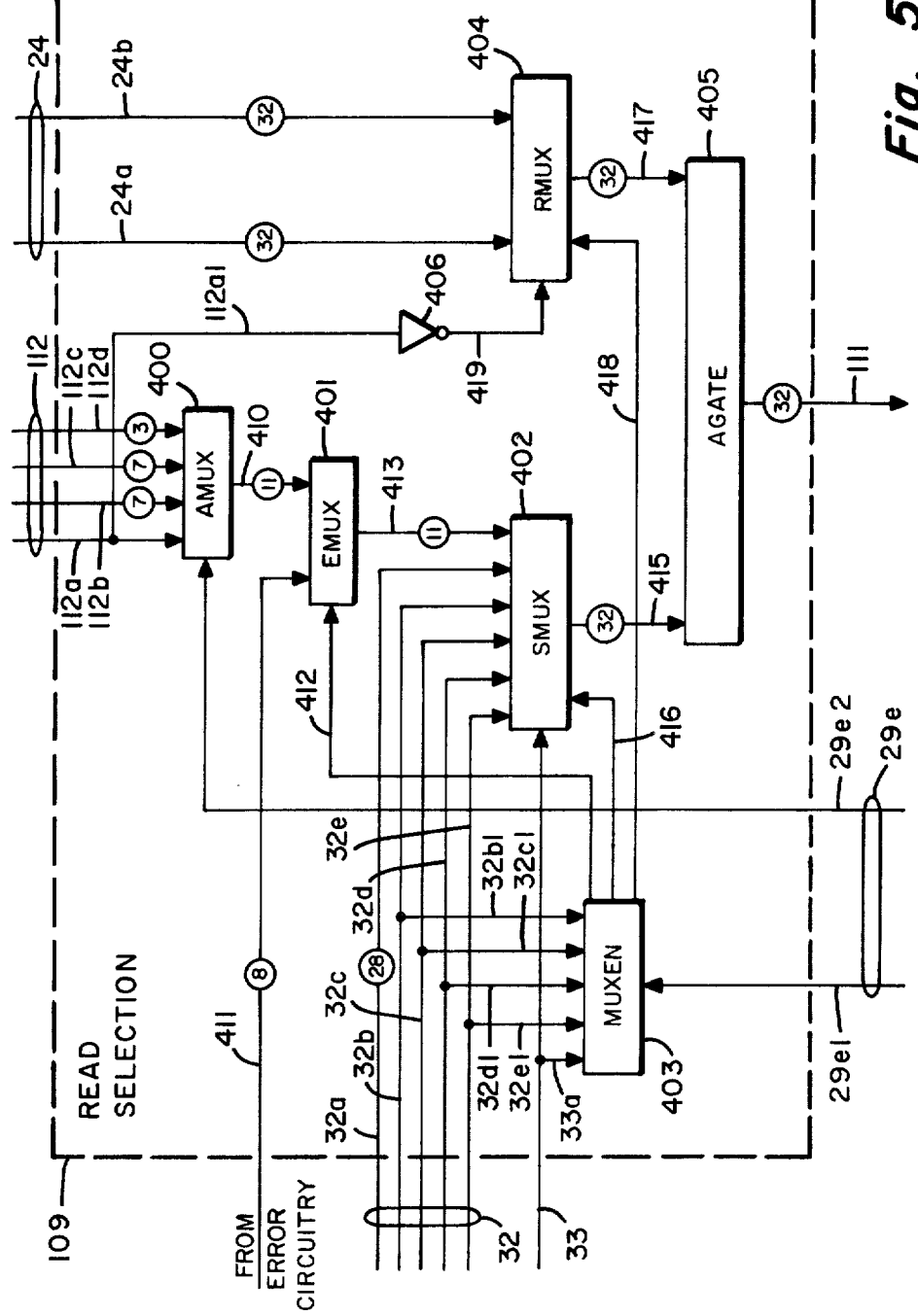

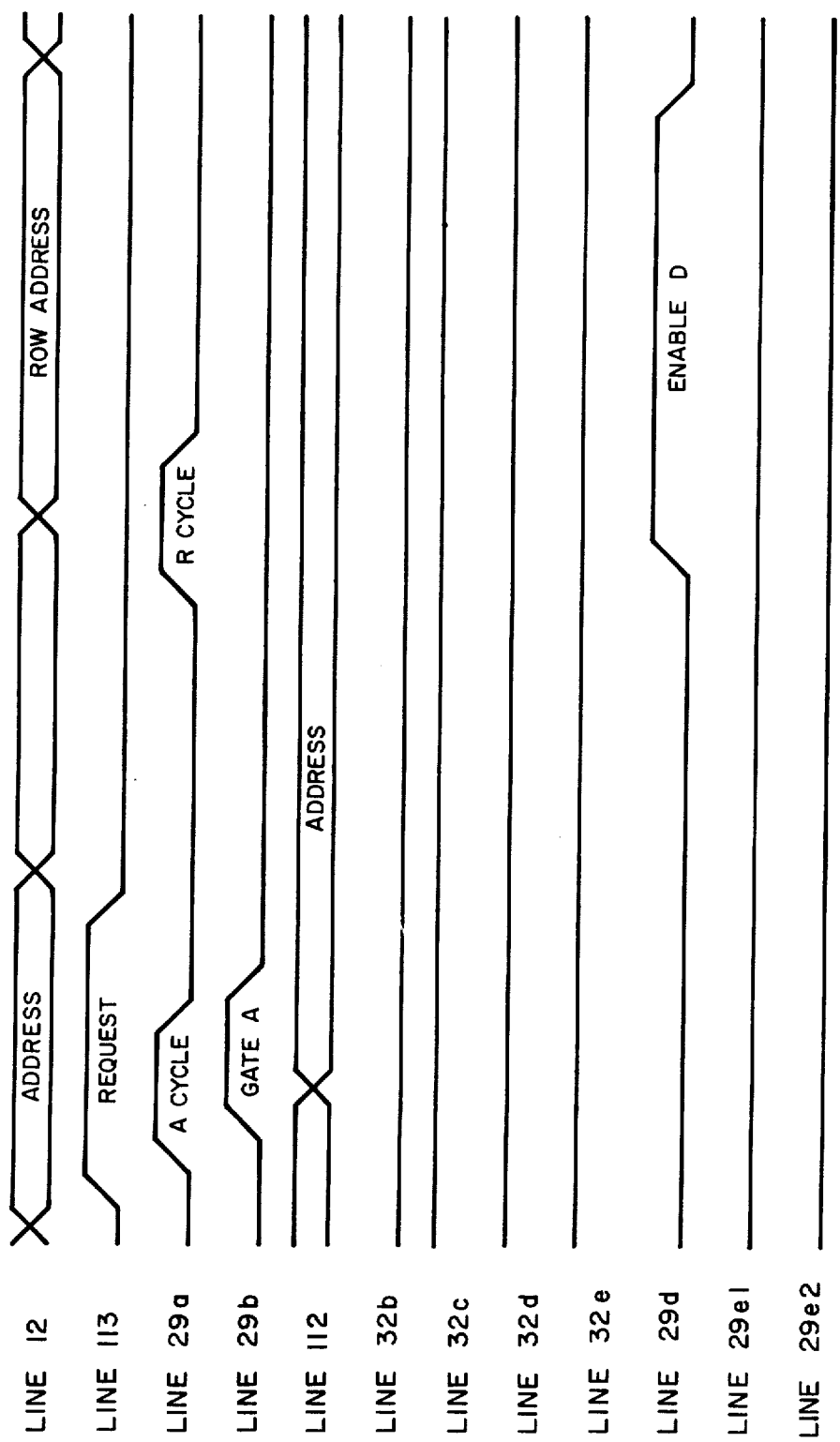

CLOSED LOOP ADDRESS

BACKGROUND OF THE INVENTION

The present invention relates generally to digital computers and more specifically to memory checking circuitry.

Most present day medium and large scale computers have the capability for the addition or deletion of memory capacity through the addition or deletion of memory modules. These memory modules quite often are operated asynchronously from one another and from other modules (e.g., Central Processing Units, Input-/Output Controllers, etc.) within the computer. Furthermore these memory modules usually have their own addressing circuitry (i.e., holding registers, translators, etc.) to permit ease of interface to other modules within the computer. It is desirable to verify the correct operation of this addressing circuitry. The most common method is to write unique data into each (or each worst case) addressable location of the memory and read the unique data for comparison with what was written. This technique has the advantage of being executed under software control obviating the need of special test equipment. This technique is somewhat disadvantageous, however, because the writing and reading of many addressable locations is time consuming and necessitates relatively large temporary storage capacity to prevent data from being destroyed. Furthermore, the use of addressable locations to test the addressing circuitry may cause errors or ambiguities in the test results if the memory arrays malfunction.

The present invention perserves the desirability of software controlled testing of the addressing circuitry while eliminating the undesirable aspects of utilizing the memory arrays during testing of the addressing circuitry.

SUMMARY OF THE INVENTION

The memory contains a status register. The contents of the various bit positions of the status register control the operation of the memory module and record status information. Two bit positions of the status register are dedicated to closed loop address. One bit position controls use of a part of the address and the second bit position controls the use of the remainder of the address. During normal operation both bit positions are clear (i.e., contain binary zeroes) causing the memory module to use each address received to address the corresponding addressable location within the memory array of the memory module. If either bit is set, the memory module returns a portion of the address received with each read request to the requestor using the same interface protocol as with a normal read. Two bit positions of the status register are used and only a part of the address is returned at any one time because of the manner in which the memory arrays are normally addressed.

To test the addressing circuitry of the memory module, a CPU under software control would set (i.e., cause to contain a binary one) one of the closed loop address bit positions of the status register by writing a binary one into that bit position of the status register. The CPU would then present the memory module with several read requests using various addresses. For each read request, the memory module would return a part of the address as if it were the contents of the addressable location specified by the address. The CPU would verify that the part of the address returned was correct for each read request. The CPU would then clear (i.e., cause to contain a binary zero) the first bit position of the status register and set the second bit position of the status register by again writing into the status register. Additional read requests would be generated to verify the correct return of the remainder of the address.

BRIEF DESCRIPTION OF THE DRAWINGS

FIG. 5d shows the detailed operation of the read selection circuitry, READ SELECTION 109.

FIG. 9a illustrates the relative timing of a closed loop row address.

DETAILED DESCRIPTION OF THE PREFERRED EMBODIMENT

The memory module chosen for initial use of the present invention was designed to be a part of an AN-/UYK-7(V) computer set. The AN/UYK-7(V) computer set is a standard piece of military hardware currently in the inventory of the U.S. Department of Defense. The reader is urged to familiarize himself with the AN/UYK-7(V) computer set to fully understand the disclosure contained herein. Circuit diagrams for the AN/UYK-7(V) computer set are designated NAVSEA 0967-LP-319-4030 and NAVSEA 0967-LP-319-4040. They may be obtained from the Naval Sea Systems Command in Washington, D.C. Also the interest and available from the same source are NAVSEA 0967-LP-319-4010 and NAVSEA 0967-LP-319-4020 which are the technical description and parts lists, respectively, for the AN/UYK-7(V) computer set.

Figure 1:
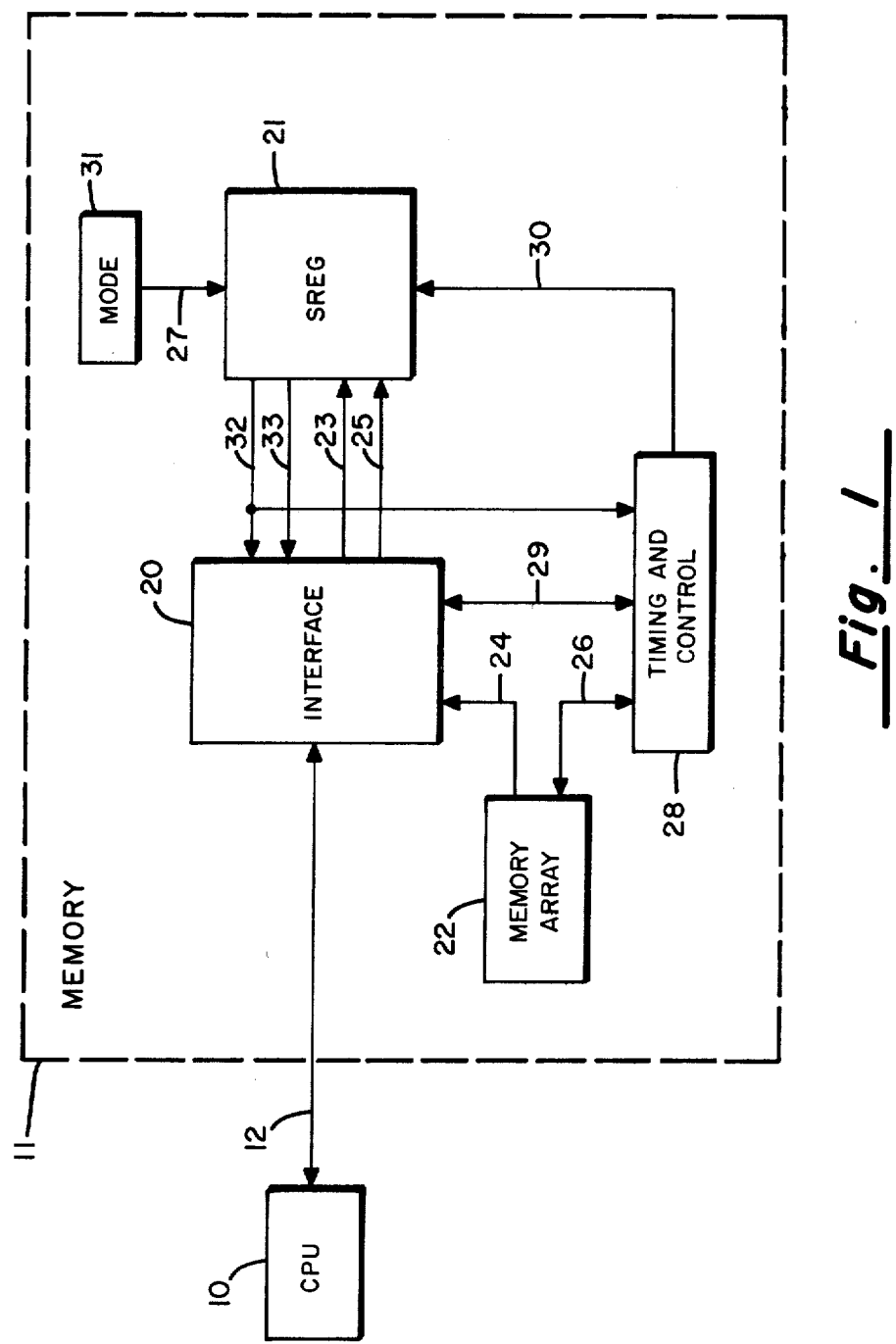
FIG. 1 is a computer containing the memory module, MEMORY 11, with its major elements.

FIG. 1 shows the computer containing memory module, MEMORY 11, employing the present invention. Central Processing Unit, CPU 10, is programmable through the execution of a series of software instructions as taught by the references cited above. CPU 10 is shown as interfacing to MEMORY 11 via line 12. Actually the interface of MEMORY 11 is quite complex, and the reader should refer to NAVSEA 0967-LP-319-4030 for further details. Only one requestor (i.e., CPU 10) is shown although MEMORY 11 may have up to either requestors as it has eight requestor ports. (See NAVSEA 0967-LP-319-4030. )

Interface circuitry, INTERFACE 20, interfaces directly with CPU 10 via line 12 and handles the protocol.

INTERFACE 20 is shown as transferring data only to status register, SREG 21, via lines 23 and 25 and timing signals to timing and control circuitry, TIMING AND CONTROL 28, via line 29. Actually, INTERFACE 20 also transfers data to MEMORY ARRAY 22 through data paths not shown.

MEMORY ARRAY 22 is a semiconductor random access store constructed using $2^{14}$ bit monolithic devices such as Motorola MCM4116, MOSTEK MK4116, or National Semiconductor MM5290. MEMORY ARRAY 22 is configured as a $2^{15}$ $2^{17}$ word by 72 bit store. The AN/UYK-7(V) computer set uses a 32 bit word without parity. Therefore, each 72 bit word provides two data words and error correction bits. MEMORY ARRAY 22 is addressed by a word formatted as in FIG. 5a. The 18 bit address shown in sufficient to select any one-half word from the possible $2^{17}$ 72 bit words of MEMORY ARRAY 22. The least significant bit (i.e., $2^0$) of the address selects the upper or lower half of one 72 bit (i.e., 64 data bits) word of MEMORY ARRAY 22. Bit positions 15, 16 and 17 are designated the ARRAY field. The ARRAY field selects the desired group of $2^{14}$ bit chips. Bit positions 1 14 select a given bit on each of the $2^{14}$ bit chips. As those skilled in the art are aware, the referenced devices used in the preferred embodiment have only seven address lines. Therefore, the addressing on each chip is accomplished by supplying first a seven bit ROW ADDRESS followed by a seven bit COLUMN ADDRESS. The impact of this addressing scheme upon the embodiment described herein will become more apparent below.

Referring again to FIG. 1, the normal mode change circuitry, MODE 31, supplies mode change commands to SREG 21 via line 27. TIMING AND CONTROL 28 receives request notification signals from INTERFACE 20 via line 29 and supplies timing signals to MEMORY ARRAY 22 via line 26, INTERFACE 20 line 29, and SREG 21 via line 30. The data path whereby MEMORY ARRAY 22 supplies read data to INTERFACE 20 is shown as line 24.

Figure 2:
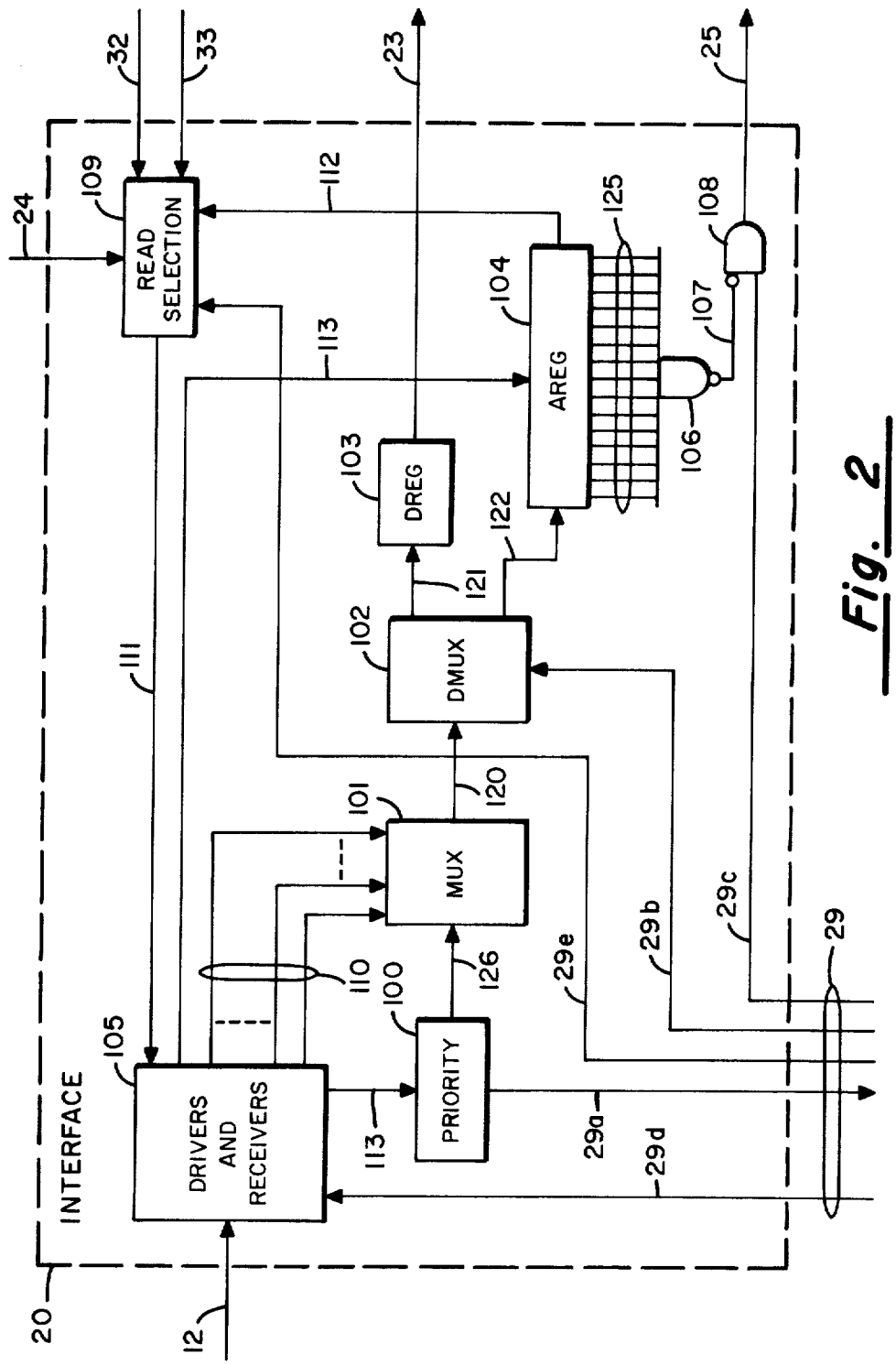
FIG. 2 is a more detailed view of interface circuitry, INTERFACE 20.

FIG. 2 provides a more detailed view of INTERFACE 20. DRIVERS AND RECEIVERS 105 receive data and control signals from CPU 10 and transfer data and control signals to CPU 10 via line 12 which is described by the cited references as the CPU operand memory bus. The cited references also supply circuit description of DRIVERS AND RECEIVERS 105. The control signals received from CPU 10 are transferred to PRIORITY 100 which determines when a request received via line 12 will be honored. The data received from CPU 10 via line 12 is transferred to multiplexer, MUX 101, via line 110. MUX 101 is necessary because MEMORY 11 may interface with up to eight requestors each with a separate interface to DRIVERS AND RECEIVERS 105 (see NAVSEA 0967-LP-319-4030). PRIORITY 100 determines when any one of the eight requestor ports will be granted access to MEMORY 11. PRIORITY 100 notifies MUX 101 via line 126 to select data from one of the eight requestors (only one shown). PRIORITY 100 notifies TIMING AND CONTROL 28 via line 29a when an access request is to be processed. MUX 101 selects data from one of the eight requestors (only one shown with its data transferred on line 110) as specified by PRIORITY 100 via line 126 and transfers the data to the demultiplexer, DMUX 102, via line 120. DMUX 102 routes the data to either the data register, DREG 103, via line 121, or to the address register, AREG 104, via line 122 based upon a command from TIMING AND CONTROL 28 received via line 29b.

The addressing format was explained above. The data word is 8, 16 or 32 bits. Therefore, DMUX 102 either routes an address word received from MUX 101 via line 120 to AREG 104 via line 122 or routes an 8, 16 or 32 bit data word received from MUX 101 via line 120 to DREG 103 via line 121. The selection is accomplished by DMUX 102 in response to a command from TIMING AND CONTROL 28 received via line 29b. AREG 104 is a register which holds the word received from DMUX 102 via line 122. AREG 104 is normally used to address the memory arrays of MEMORY 11 via circuitry which is not shown. AREG 104 is also used in accessing SREG 21 through circuitry which is shown. AREG 104 holds the address word. In the preferred embodiment, SREG 21 is accessed using address $77777_8$ (but only if MEMORY 11 is in MAINTENANCE mode as explained below). Therefore, to select access to SREG 21 requires AREG 104 to have bit position $2^0-2^{14}$ (i.e., $2^0, 2^1, 2^2, 2^3, \ldots, 2^{14}$) contain binary ones. This provides an address of $77777_8$. (Note that the address is really $X77777_8$ wherein X is determined by address bits $2^{15}-2^{17}$ which are not used to determined access to the status register.) The contents of the 15 bit positions (i.e., $2^0, 2^1, 2^2, 2^3, \ldots, 2^{14}$) are transferred via lines 125 to AND gate 106. If and only if all 15 bit positions contain binary ones (i.e., AREG 104 contains an address word of $X77777_8$), AND gate 106 makes line 107 low. Line 107 is high if AREG 104 contains any other address word. AND gate 108 makes line 25 a high if and only if line 29c is high and line 107 is low. Line 29c is a timing signal received from TIMING AND CONTROL 28.

As stated above, DREG 103 receives an 8, 16 or 32 bit data word from DMUX 102 via line 121. DREG 103 has a number of outputs. The only one relating to the present invention is shown as line 23. Line 23 contains four conductors representing the contents of the four bit positions of DREG 103 which will be transferred to SREG 21 at those bit positions important to closed loop address. In the preferred embodiment they are bit positions $2^{16}$, $2^{17}$, $2^{18}$ and $2^{19}$. If one of these bit positions contains a binary zero, the corresponding one of the four conductors of line 23 is at a high. If one of these bit positions contains a binary one, the corresponding one of the four conductors of line 23 is at a low. Line 32 transfers the contents of the status register bit positions of concern (i.e., bits $2^{16}$, $2^{17}$, $2^{18}$ and $2^{19}$) to the read selection circuitry, READ SELECTION 109. Line 33 transfers an enable signal to READ SELECTION 109 which is discussed further below. READ SELECTION 109 also receives the contents of AREG 104 via line 112. Line 29e provides READ SELECTION 109 with some required timing signals. DRIVERS AND RECEIVERS 105 receive an enable from TIMING AND CONTROL 28 via line 29d.

Figure 3:
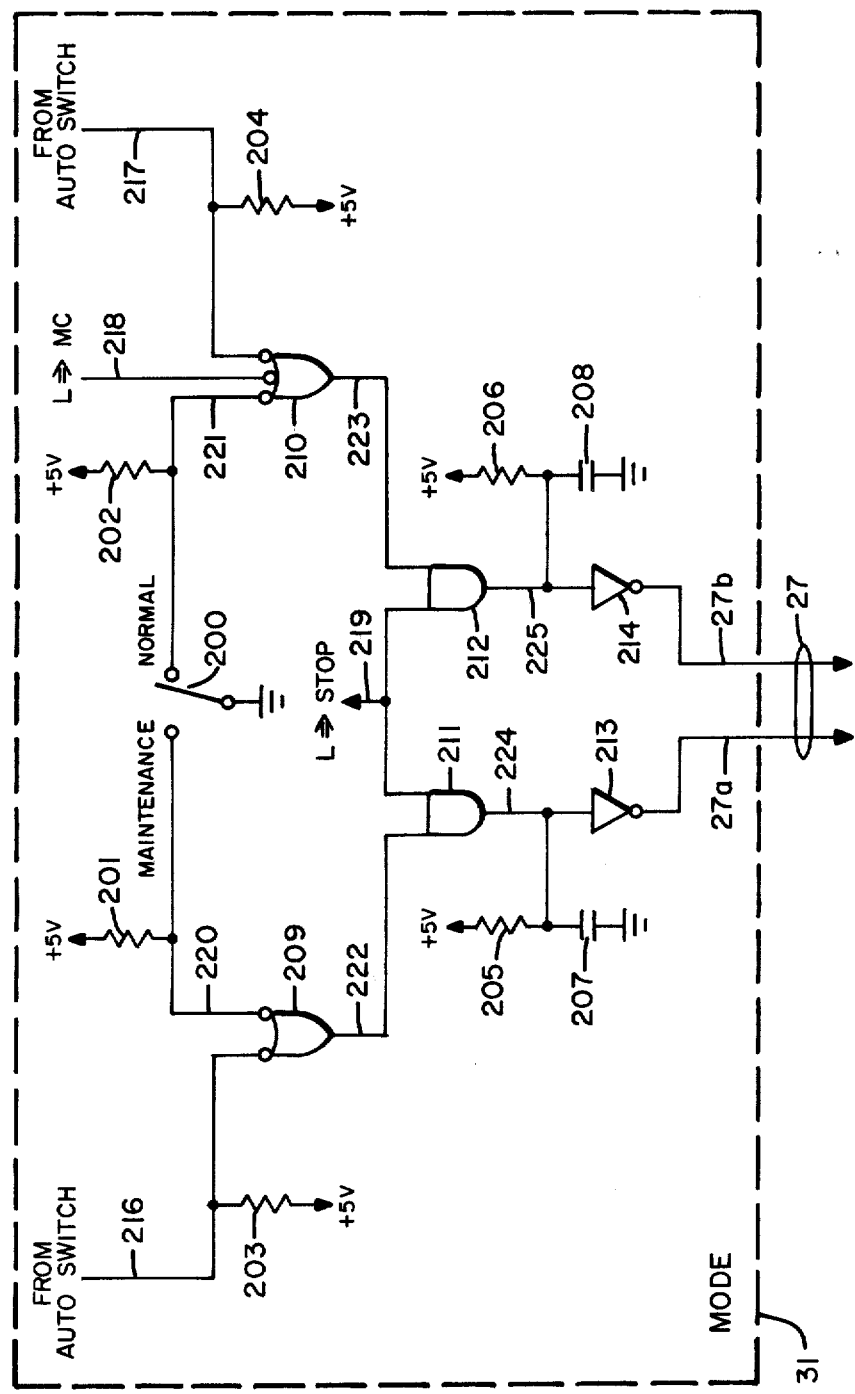
FIG. 3 describes the circuitry which provides the capability for manual mode change.

FIG. 3 is a circuit diagram of the manual mode change circuit, MODE 31. Single pole-double throw (SPDT) switch 200 is a means whereby an operator enters the mode change. SPDT switch 200 is a momentary contact switch to provide some noise immunity. The use of a momentary contact switch is permissible because a flip-flop, discussed below, stores the actual switch position. Upon being switched to MAINTENANCE mode, SPDT switch 200 momentarily couples line 220 to ground. NOR gate 209 senses this as a low causing NOR gate 209 to make line 222 high. Assuming line 219 is also high (i.e., no stop signal is present), AND gate 211 allows line 224 to be high. Inverter 213 inverts the high and applies a low to line 27a. MAINTENANCE mode may also be entered via automatic means at line 216. This is not disclosed because it has not yet been implemented. Resistors 201, 203 and 205 are "pullup" resistors of value 1,000 ohms. They are used to source current to the various lines (i.e., line 220, line 216 and line 224, respectively) to provide desirable risetimes on transitions to high. Capacitor 207 decouples high frequency switching transients. The STOP signal prevents mode change during primary power transients.

A switch to NORMAL mode is accomplished by SPDT switch 200 being placed into the NORMAL position. The signal is propagated in similar fashion through NAND gate 210, AND gate 212 and inverter 214. Pullup resistors 202, 204 and 206 are also 1,000 ohms. A switch to NORMAL mode results in inverter 214 applying a low to line 27b.

Figure 4:
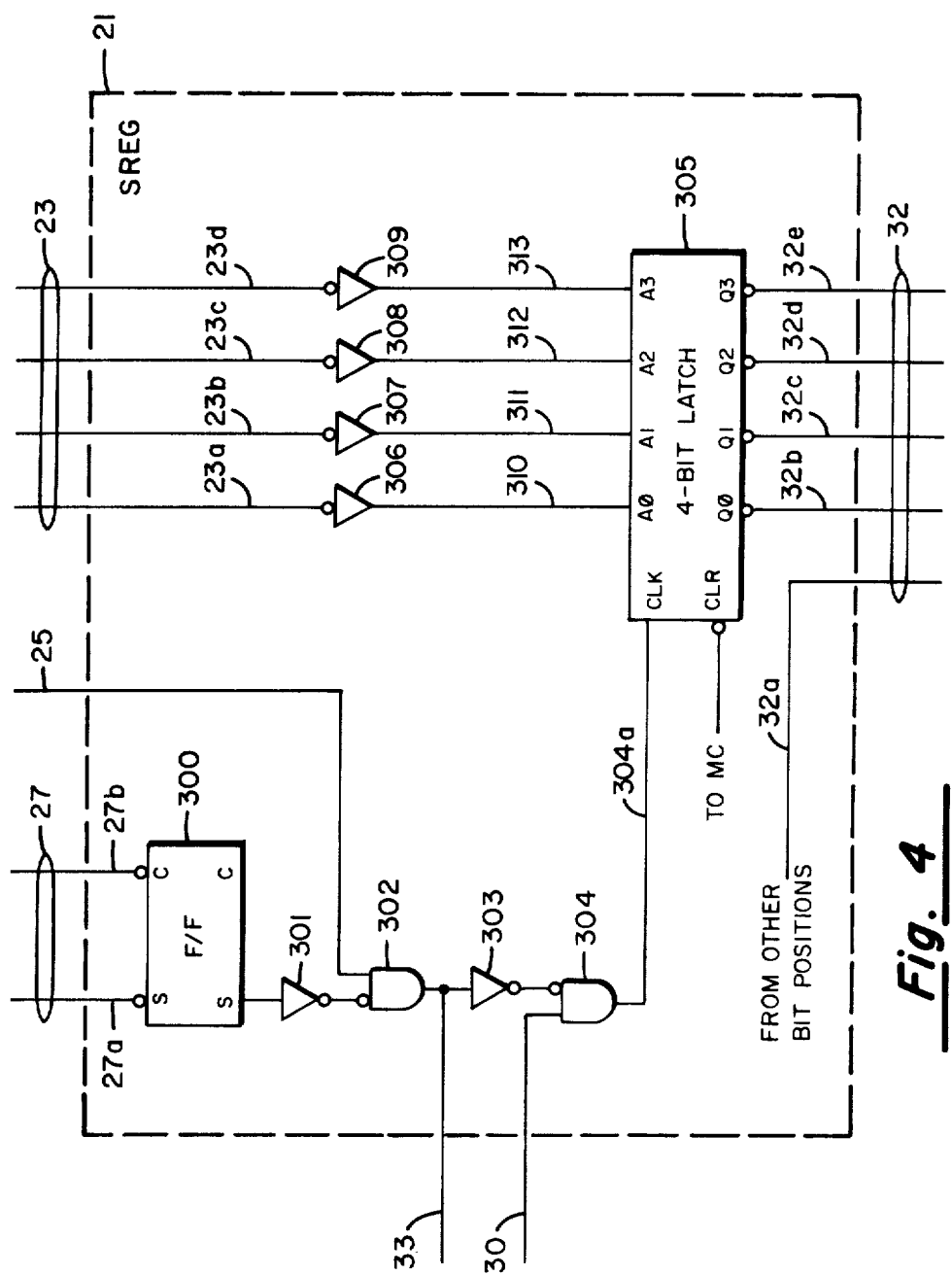
FIG. 4 shows the status register circuitry involved in closed loop address.

FIG. 4 shows the operation of status register, SREG 21. Only four bit positions (i.e., bit positions $2^{16}$, $2^{17}$, $2^{18}$ and $2^{19}$) are illustrated for clarity. The remaining bit positions of SREG 21 provide functions not relevant to the present invention. Line 27a and line 27b transfer the mode change signals (i.e. line 27a=low→MAINTENANCE mode; line 27b=low→NORMAL mode) received from MODE 31. Flip-flop, F/F 300, actually stores the current mode (i.e., F/F 300 set→MAINTENANCE mode F/F 300 clear→NORMAL mode). If F/F 300 is set, set output, S, is high. If F/F 300 is clear, S is low. The output of F/F. 300 is inverted by inverter 301 and applied to gate 302. The output of gate 302 is high if F/F 300 is set (i.e., MAINTENANCE mode, and line 25 is high (i.e., AREG 104 contains an address word of $X77777_8$ as shown on FIG. 2). The output of gate 302 is inverted by inverter 303 and applied as an input to gate 304. During the time when line 30 from TIMING AND CONTROL 28 is high and the output of inverter 303 is a low (i.e., output of gate 302 is high), the output of gate 304 is high which is transferred to the clock input, CLK, the four bit latch, 4-BIT LATCH 305 which is a monolithic device of the type 54LS174. Each of the four conductors of line 23 (i.e., lines 23a, 23b, 23c and 23d) is high if the corresponding bit position (i.e., $2^{16}$, $2^{17}$, $2^{28}$ or $2^{19}$ of DREG 103 contains a binary zero and is low if the corresponding bit position of DREG 103 contains a binary one as explained above. The four INVERTERS (i.e., 306, 307, 308 and 309) invert the signals found on the four conductors of line 23 and provide the inverted signals to 4-BIT LATCH 305 via lines 310, 311, 312 and 313. For example, INVERTER 306 receives a low via line 23a if bit position 216 of DREG 103 contains a binary one and supplies a high to input A$\phi$ of 4-BIT LATCH 305. Similarly, INVERTER 307 receives a high via line 23b if bit positions $2^{17}$ of DREG 103 contains a binary zero and supplies a low to input A1 of 4-BIT LATCH 305.

The outputs of 4-BIT LATCH 305 are complement outputs at Q$\phi$, Q1, Q2 and Q3. That is if all bit positions of 4-BIT LATCH 305 contain binary zeros, Q$\phi$, Q1, Q2 and Q3 are high. If all bit positions of 4-BIT LATCH 305 contain binary one, Q$\phi$, Q1, Q2 and Q3 are low. The state of a bit position of 4-BIT LATCH 305 is changed only when line 304a is high. If line 304a is high, the state of the four bit positions of 4-BIT LATCH 305 are determined by lines 310, 311, 312 and 313. For example, if line 310 is high and line 304a is high, bit position $2^{16}$ will be caused to contain a binary one and line 32b will become low. Similarly, if line 311 is low and line 304a is high, bit position $2^{17}$ will be caused to contain a binary zero and line 32c will become high. Lines 32b, 32c, 32d and 32e contain the complement outputs of bit positions $2^{16}$, $2^{17}$, $2^{18}$ and $2^{19}$ of the status register respectively. See Table A. The complement output of the remaining 28 bit positions (i.e., $2^0$–$2^{15}$ and $2^{20}$–$2^{31}$) of the status register are represented by line 32a.

Figures 5A, 5B, 5C, 6:
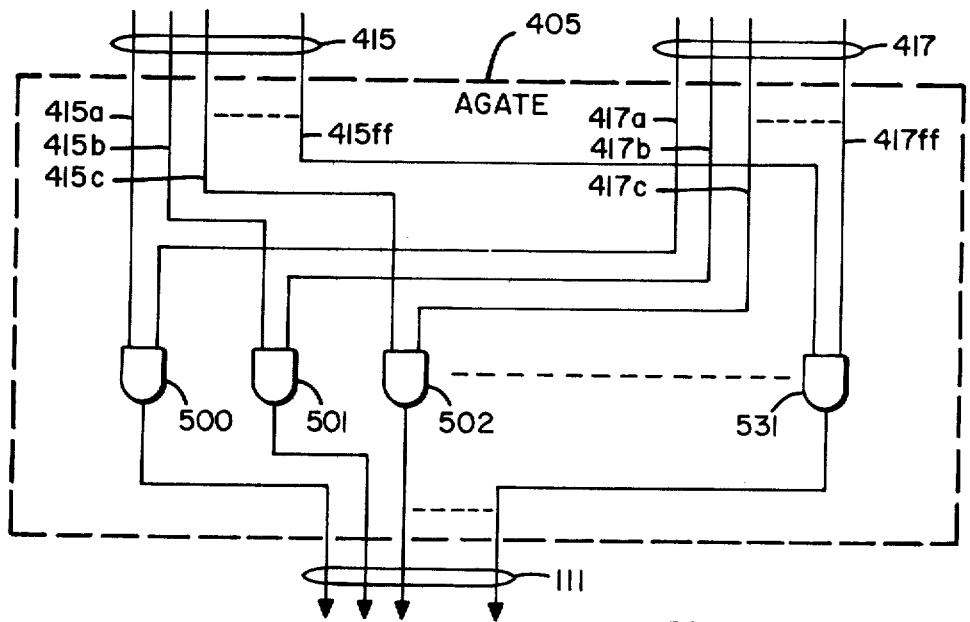
FIG. 5a shows the format of an address.
FIG. 5b shows the format of the returned ROW address.
FIG. 5c shows the format of the returned column address.
FIG. 6 shows how the AND-gate circuitry, AGATE 405 is wired.

As explained above, FIG. 5a provides the format of the address word received by MEMORY 11. As also explained earlier, MEMORY ARRAY 22 requires presentation of a seven bit row address along with the three bits to select the chip group (i.e., ARRAY field) followed by presentation of a seven bit column address along with the ARRAY field. For that reason two closed loop address modes are defined. FIG. 5b shows the format of the closed loop row address returned to CPU if bit $2^{16}$ of the status register is set (i.e., contains a binary one).

TABLE A

| SR BIT POSITION | CONDUCTOR |
|---|---|
| Bit 16 | 32b |
| Bit 17 | 32c |
| Bit 18 | 32d |
| Bit 19 | 32e |

FIG. 5c shows the format of the closed loop column address returned to CPU 10 if bit $2^{17}$ of the status register is set. The mode wherein both bits $2^{16}$ and $2^{17}$ are set is undefined and will not be discussed further.

FIG. 5d shows the details of read selection circuitry, READ SELECTION 109. Four multiplexers are shown (i.e., AMUX 400, EMUX 401, RMUX 404 and SMUX 402). The standard monolithic part 54LS158 is used which provides selection of one of two groups of four signals. Each of the four multiplexers shown uses as many 54LS158 devices as required for the number of signals to be handled. Each of the four multiplexers has inputs from two data streams, an output of one data stream, a selector, and an enable. Table B shows the connections to each multiplexer. The grounded enable causes the devices to be enable at all times. The multiplexer enable circuitry, MUXEN 403 provides control signals to EMUX 401, RMUX 418 and SMUX 402. AGATE 405 "ANDs" the two data streams from line 415 and 417 into one data stream at line 111.

AMUX 400 selects row or column address formats. AMUX 400 is presented with an address of the format shown in FIG. 5a with bit $2^0$ (U/L) on line 112a, bits $2^1$–$2^7$ (row address) on line 112b, bits $2^8$–$2^{14}$ (column address) on line 112c, and bits $2^{15}$–$2^{17}$ (ARRAY field) on line 112d. AMUX 400 places a row address (see FIG. 5b) on line 410 if line 29e2 from TIMING AND CONTROL 28 is low and places a column address (see FIG. 5c) on line 410 if line 29e2 from TIMING AND CONTROL 28. The selection of row address or column address based upon the state of line 29e2 is dynamic (i.e., line 29e2 changes state) during a normal access of MEMORY ARRAY 22.

TABLE B

| ELEMENT | INPUT 0 (A0-D0) | INPUT 1 (A1-D1) | OUTPUT (ZA-ZD) | SELECTOR | ENABLE |
|---|---|---|---|---|---|
| AMUX 400 | Line 112a, c, & d | Line 112a, b, & d | Line 410 | Line 29e2 | Ground |

TABLE B-continued

| ELEMENT | INPUT 0 (A0-D0) | INPUT 1 (A1-D1) | OUTPUT (ZA-ZD) | SELECTOR | ENABLE |
| --- | --- | --- | --- | --- | --- |
| EMUX 401 | Line 410 | Line 411 | Line 413 | Line 412 | Ground |
| RMUX 404 | Line 24b | Line 24a | Line 417 | Line 419 | Line 418 |
| SMUX 402 | Line 413 | Line 32 | Line 415 | Line 33 | Line 416 |

This circuitry is not shown, however, as not relevant to the present invention wherein line 29e2 is a constant low if bit position $2^{16}$ of SREG 21 is set and high if bit position $2^{17}$ of SREG 21 is set. (Note that both bits clear is normal access of MEMORY ARRAY 22 and both bits set is undefined.)

EMUX 401 receives the eight bit error log data via line 411 or the address (row or column) data via line 410 and selects one or the other for transfers to SMUX 402 via line 413 based upon the state of line 412 from MUXEN 403. If line 412 is high, the error log data is selected. If line 412 is low the address data is selected. If the eight bit error log data is selected, the remaining three bits transferred via the 11-bit line 413 are binary ones. The circuitry determining the state of line 412 is explained below.

SMUX 402 selects either the 32-bit contents of SREG 21 received via line 32 or the 11bit word received via line 413 based upon the state of line 33. If line 33 is low, SMUX 402 selects the 32-bit contents of SREG 21. If line 33 is high, SMUX 402 selects the 11-bit word received via line 413. The state of line 33 is determined as explained above by AND gate 302 (see FIG. 4). Line 416 is connected to the enable of SMUX 402. If line 416 is low, SMUX 402 is enabled for output. If line 416 is high, SMUX 402 is disabled and all 32 conductors of line 415 are high. If line 33 is high and the 11-bit word received via line 413 is selected, bits 211-231 are high (see also FIG. 5b and FIG. 5c).

RMUX 404 is used to perform the upper/lower selection based upon bit $2^0$ of the address word. Line 24a and line 24b transfer the upper and lower 32 bits respectively. Line 112a transfers bit $2^0$ of the address word. Inverter 406 inverts the state of line 112a1 and applies it via line 419 to the selection input of RMUX 404. Line 418 is the enable input to RMUX 404 received from MUXEN 403. If line 418 is low, RMUX 404 transfers the upper or lower 32 bits received via lines 24a and 24b, respectively as selected by line 419 to line 417. If line 418 is high, RMUX 404 makes all 32 conductors of line 417 high.

FIG. 6 shows the circuitry in AGATE 405. The AND gates 500-531 combine the two 32-bit data streams received from line 415 and 517 into a single 32-bit data stream which is transferred to DRIVERS AND RECEIVERS 105 via line 111. As explained below, SMUX 402 and RMUX 404 cannot both be enabled simultaneously. Therefore, all 32 conductors of either line 415 or line 417 must be all ones.

Figure 7:
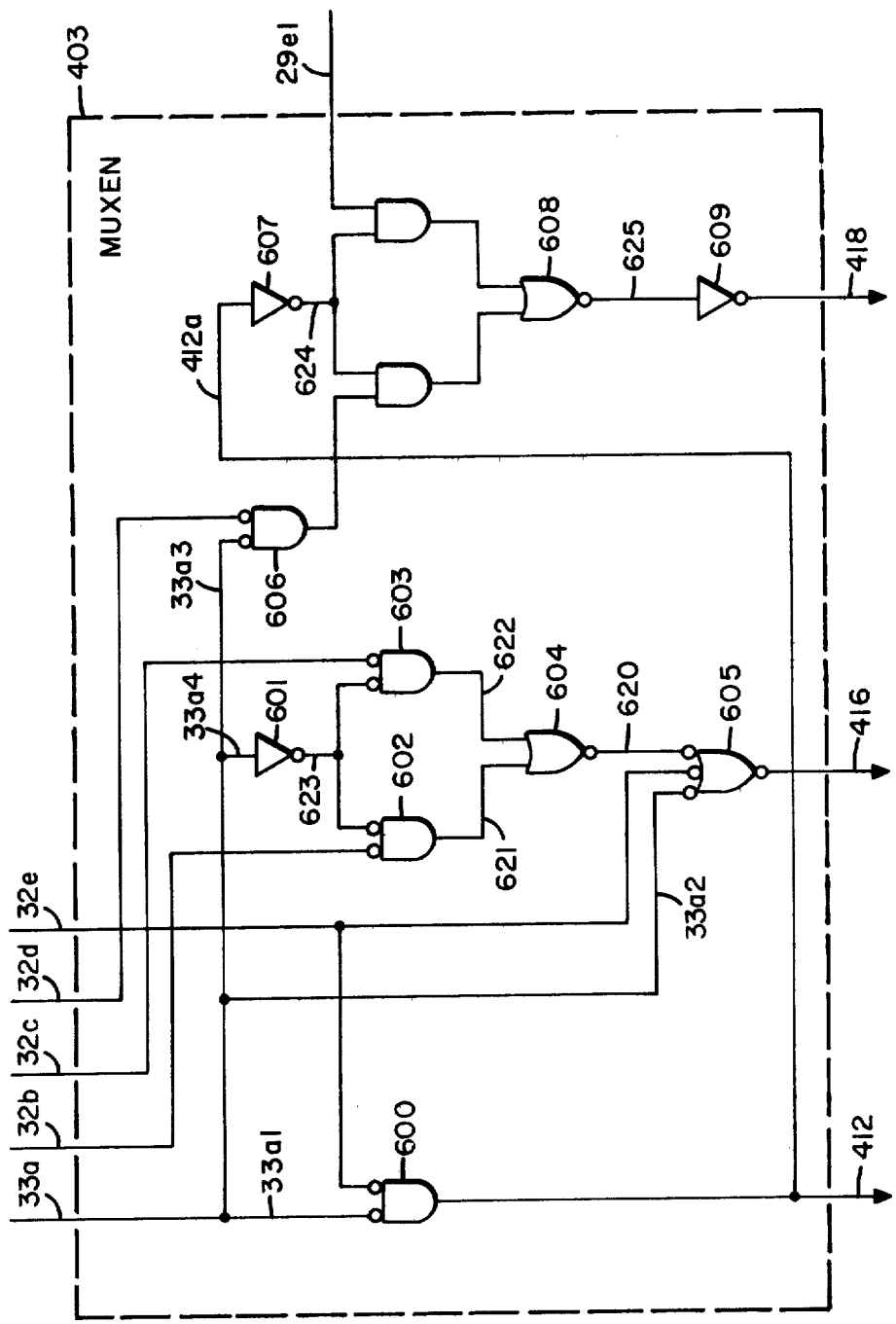
FIG. 7 illustrates the multiplexer enable circuitry, MUXEN 403.

FIG. 7 shows the circuitry of MUXEN 403. Line 412 is high selecting error log data (see also FIG. 5d) at EMUX 401 if line 32e is low and line 33a1 is low. Line 412 is high selecting address data if either line 32e or line 33a1 is high. Line 32c is low if bit $2^{19}$ is set in SREG 21 (see FIG. 4) and line 33a1 (i.e., 33 and 33a) is low if SREG 21 is not being addressed (also see FIG. 4).

Line 416 enables SMUX 402 if it is low and disables SMUX 402 if it is high. OR gate 605 makes line 416 low (enables SMUX 402) if line 33a2 is low (i.e., SREG 21 is not being addressed as explained above) or if line 32e is low (i.e., bit $2^{19}$ of SREG 21 is set) or if either bit $2^{16}$ (row address) or bit $2^{17}$ (column address) is set and SREG 21 is not being addressed (i.e., line 33a4 is low).

Line 418 is low enabling RMUX 404 if the error log data has not been selected by EMUX 401 (i.e., line 412 is low) and either TIMING AND CONTROL 28 makes line 29e1 high signifying a read from MEMORY ARRARY 22 of bit $2^{18}$ of SREG 21 is set and SREG 21 is not being addressed. The illustration of RMUX 404 and associated circuitry is shown for completeness and not because of its necessity of the present invention. The logic devices used to implement the present invention are all common schottky or low power schottky devices.

Figure 8:
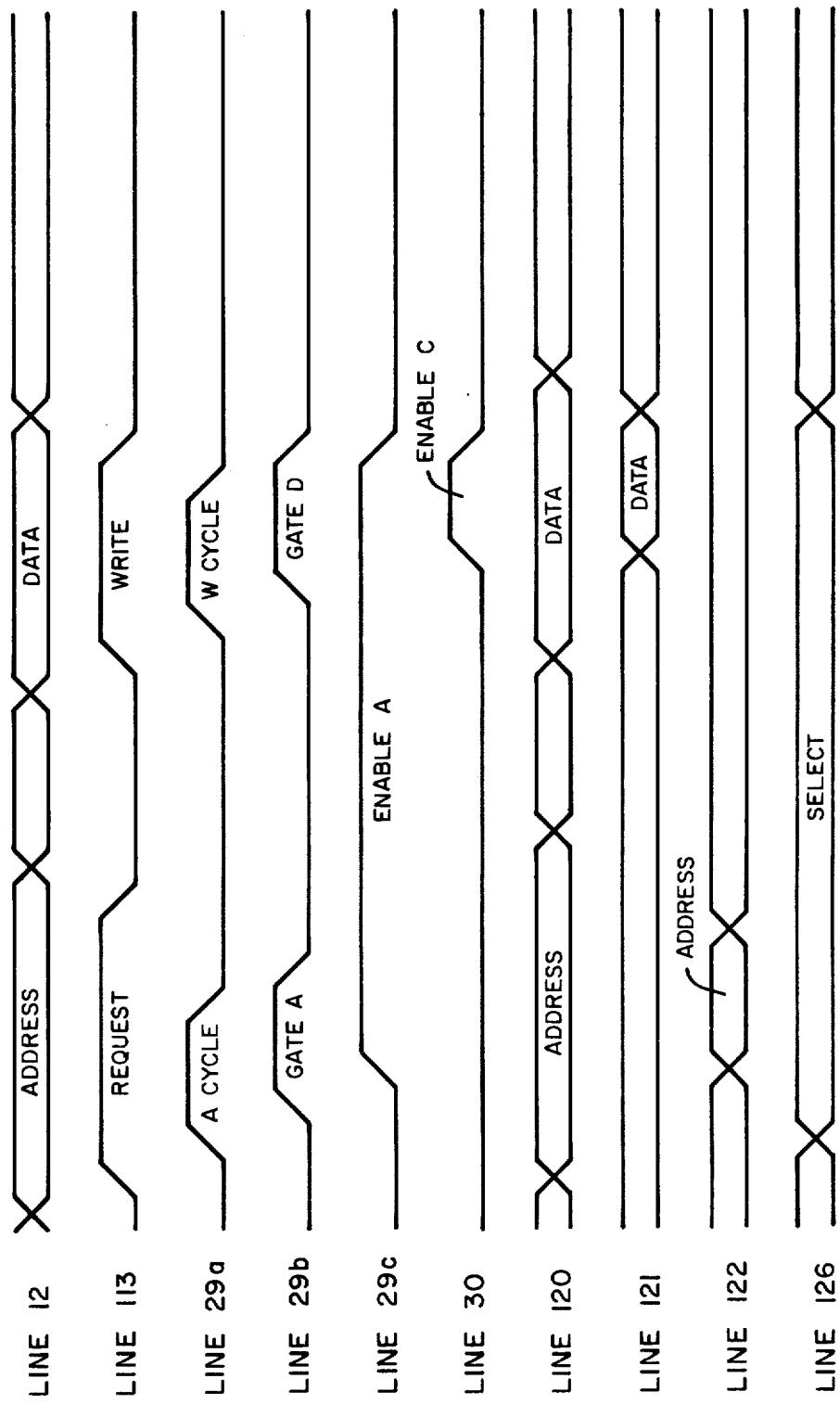
FIG. 8 shows the relative timing of a write into the status register.

FIG. 8 shows the relative timing of the key signals required to set one of the bit positions of SREG 21 (i.e., $2^{16}$ or $2^{17}$) to a binary one causing closed loop row or column address return. Line 12 contains the data from CPU 10 transferred as an address word and an 8, 16 or 32 bit data word. Line 113 shows the presence of the access request and the write command. Line 29a indicates timing of the address word cycle, ACYCLE, and the data word cycle, WCYCLE; gating signals are supplied by TIMING AND CONTROL 28 to DMUX 102 via line 29b to gate the address word to AREG 104 (i.e., GATE A) and to gate the data word to DREG 103 (i.e., GATE D). TIMING AND CONTROL 28 transfers ENABLE A via line 29c to enable the address determination result (i.e., does AREG 104 contain X77777$_8$) to line 25. Lines 120, 121 and 122 conduct the address word and the data word. Priority 100 notifies MUX 101 of which of the possible eight interfaces to select via line 126.

FIG. 9a shows the timing of closed loop row address. Line 12 contains first the address (see FIG. 5a) being transferred to MEMORY 11 from CPU 10 and then ROW ADDRESS (see FIG. 5b) being transferred to CPU 10 from MEMORY 11. The REQUEST signal is transferred to priority 100 from DRIVERS AND RECEIVERS 105 via line 112. Signals indicating the address and read cycles are transferred via line 29a. Line 29b gates the address as before. Line 112 contains the address word during the remaining time. Line 32b is low indicating that bit $2^{16}$ of SREG 21 is set (i.e., row address). Lines 32c, 32d and 32e are low indicating that bits $2^{17}$, $2^{18}$ and $2^{19}$ of SREG 21 are clear. Line 29d enables DRIVERS AND RECEIVERS 105 to place the data received via line 111 on line 12. Line 29e1 is low indicating no access to MEMORY ARRAY 22 is in process. Line 29e2 is low indicating row address selection (i.e., bit $2^{16}$ of SREG 21 is set).

Figure 9B:
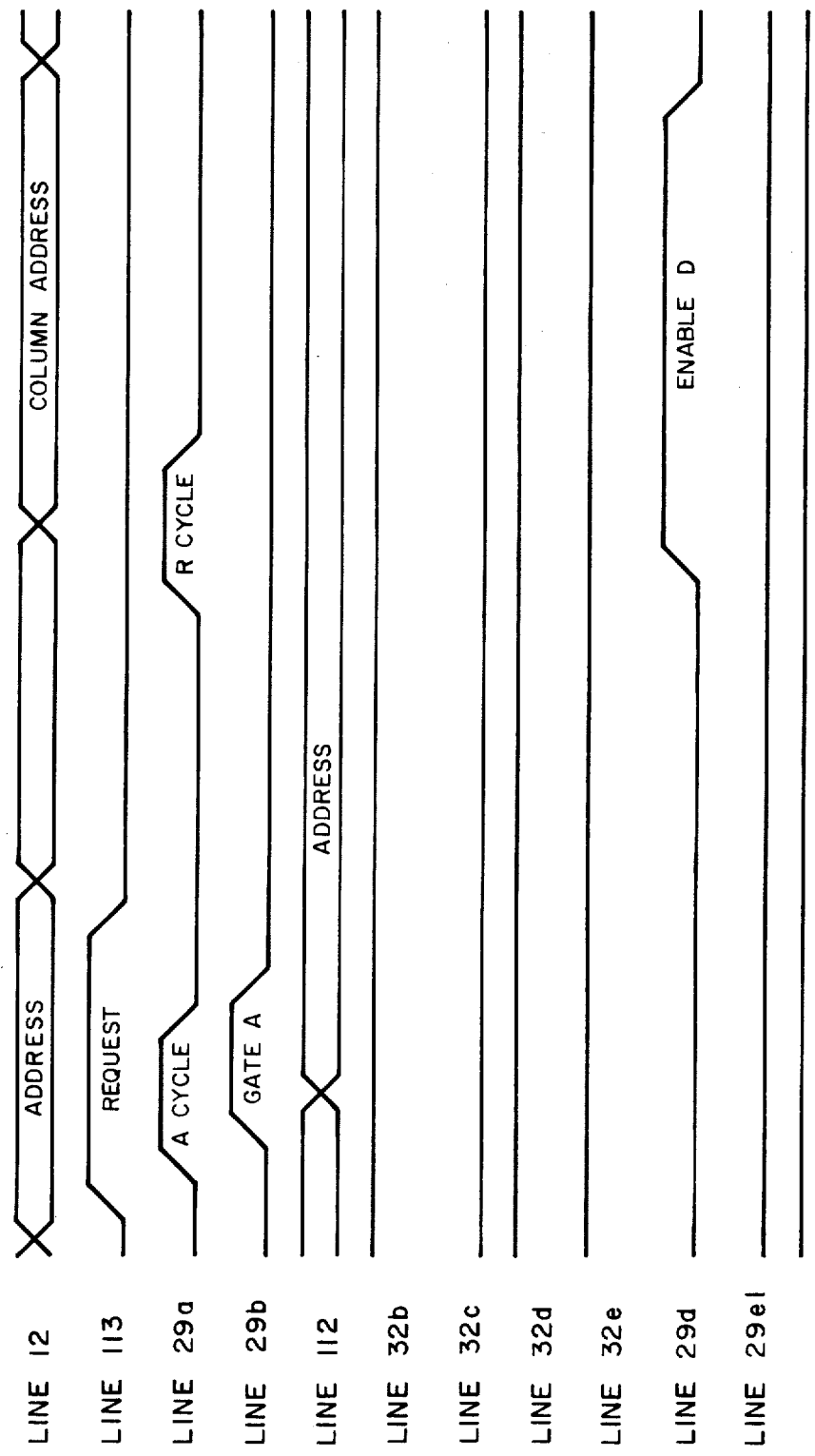
FIG. 9b shows the relative timing of a closed loop column address.

FIG. 9b shows the timing of closed loop column address. It is identical to closed loop row address (i.e., FIG. 9a) except line 32b is high indicating bit $2^{16}$ of SREG 21 clear, line 32c is low indicating bit $2^{17}$ of SREG 21 set, and line 29e2 is high indicating column address selection (i.e., bit $2^{17}$ is SREG 21 is set).

What is claimed is:

1. In a computer having a central processing unit programmable through the execution of a series of software instructions and having a memory module containing a plurality of addressable locations and containing addressing circuits which permit said central processing unit to read from or write into at least one of said plurality of addressable locations by transferring to said addressing circuits an address specifying one of said plurality of addressable locations to read from or write into, the apparatus for permitting said central processing unit to test said addressing circuits, comprising:

means responsively coupled to said central processing unit for recording that said central processing unit is testing said addressing circuits; and means responsively coupled to said addressing circuits, said central processing unit, and said recording means for transferring to said central processing unit the address transferred to said addressing circuits when said recording means indicates that said central processing unit is testing said addressing circuits.

2. The apparatus for permitting said central processing unit to test said addressing circuits according to claim 1 wherein said recording means further comprises:

a status register having contents alterable by said central processing unit through the execution of one of said series of software instructions.

3. In a computer having a central processing unit programmable through the execution of a series of software instructions and having a memory module containing a plurality of addressable locations and containing addressing circuits which permit said central processing unit to read from or write into at least one of said plurality of addressable locations by transferring to said addressing circuits an address specifying one of said plurality of addressable locations to read from or write into, and by transferring to said memory module a request signal corresponding to said address to indicate whether to read from or write into said one of said plurality of addressable locations specified by said address, the apparatus for permitting said central processing unit to test said addressing circuits, comprising:

means responsively coupled to said central processing unit for recording that said central processing unit is testing said addressing circuits;

means responsively coupled to said addressing circuits, said central processing unit, and said recording means for transferring to said central processing unit the address transferred to said addressing circuits when said recording means indicates that said central processing unit is testing said addressing circuits and when said request signal corresponding to said address indicates that said one of said plurality of addressable locations is to be read from.

4. The apparatus for permitting said central processing unit to test said addressing circuits according to claim 3 wherein said recording means further comprises:

a status register having contents alterable by said central processing unit through the execution of one of said series of software instructions.

5. A computer according to claim 3 wherein said memory module further comprises:

means responsively coupled to said recording means and said addressing circuitry for permitting an operator to manually select a maintenance mode.

6. A computer according to claim 5 wherein said recording means further comprises:

a status register having contents alterable by said central processing unit through the execution of one of said series of software instructions whenever said permitting means indicates that said operator has manually selected said maintenance mode.

7. A computer according to claim 5 wherein said recording means further comprises:

a status register into which said central processing unit may write by transferring to said addressing circuits a predefined address and said request signal corresponding to said predefined address to indicate a write into said status register whenever said permitting means indicates that said operator has manually selected said maintenance mode.

8. In a computer having a central processing unit programmable through the execution of a series of software instructions and having a memory module containing a plurality of addressable locations and containing addressing circuits which permit said central processing unit to read from or write into at least one of said plurality of addressable locations by transferring to said addressing circuits an address specifying one of said plurality of addressable locations to read from or write into, and by transferring to said memory module a request signal corresponding to said address to indicate whether to read from or write into said one of said plurality of addressable locations specified by said address and containing a switch permitting an operator to manually select a maintenance mode, the improvement comprising:

a status register into which said central processing unit may write by transferring to said addressing circuits a predefined address and said request signal corresponding to said predefined address to indicate a write into said status register whenever said switch indicates that said operator has selected said maintenance mode, having at least two binary bit positions; and means responsively coupled to said addressing circuits, said central processing unit, and said status register for transferring to said central processing unit a first portion of said address transferred to said addressing circuits whenever a first predefined bit position of said status register is set and for transferring to said central processing unit a second portion of said address transferred to said addressing circuits whenever a second predefined bit position of said status register is set.

* * * * *